United States Patent [19]
Yousuf et al.

[11] Patent Number: 6,128,757
[45] Date of Patent: Oct. 3, 2000

[54] LOW VOLTAGE SCREEN FOR IMPROVING THE FAULT COVERAGE OF INTEGRATED CIRCUIT PRODUCTION TEST PROGRAMS

[75] Inventors: Syed Hasan Yousuf, Saratoga; Veronica Collaco Stewart; Hai Xuan Nguyen, both of San Jose, all of Calif.

[73] Assignee: LSI Logic Corporation, Milpitas, Calif.

[21] Appl. No.: 09/098,172

[22] Filed: Jun. 16, 1998

[51] Int. Cl.$^7$ .................................................. G01R 31/28
[52] U.S. Cl. ............................................................. 714/724
[58] Field of Search ..................................... 714/724, 735, 714/736; 324/73.1, 158.1

[56] References Cited

U.S. PATENT DOCUMENTS

| | | | |
|---|---|---|---|
| 5,337,262 | 8/1994 | Luthi et al. | 324/73.1 X |
| 5,644,251 | 7/1997 | Colwell et al. | 326/16 |
| 5,668,745 | 9/1997 | Day | 364/580 |
| 5,670,890 | 9/1997 | Colwell et al. | 324/765 |

OTHER PUBLICATIONS

IBM Microelectronics, Defect Localization—Fault Isolation, at http://www.chips.ibm.com/services/asg/capabilities/asweb07.html, Last Update Mar. 26, 1998, pp. 1–10.

IBM Microelectronics, Enhance VLSI functional failure analysis with IDDQ current measurements, at http://www.chips.ibm.com/services/asg/appnotes/app01.html, Last Update Mar. 26, 1998, pp. 1–3.

*Primary Examiner*—Hoa T. Nguyen

[57] ABSTRACT

A method for improving the fault coverage of functional tests for integrated circuits by establishing a design-specific low voltage functional screening procedure. In the disclosed embodiment of the invention, a reduced voltage test threshold is established by comparing the results of an iterative test procedure executed on a set of known good integrated circuits and integrated circuits which have passed traditional functional test programs but manifested problems in the field. For a given device under test, the iterative procedure commences by applying a system clock and nominal power supply voltage. A set of functional test vectors is then executed on the device using automated test equipment (ATE). The results are compared with expected test results to determine if the device is a passing device under the initial test conditions. If so, the power supply voltage is decremented by a predetermined value and the test process is repeated. This iterative process continues until the device under test fails the functional test. At this point, the power supply voltage at which the device under test has failed functional testing or, alternatively, the previous power supply voltage, is stored in a database. The testing procedure is then repeated for a statistically significant group of additional known good parts/bad parts. After databases have been compiled for the good and bad parts, the results of the testing procedure are examined to determine the voltage below which substantially all the known good parts pass and above which substantially all the bad parts fail. This voltage is then utilized as the reduced voltage test threshold value for a production test program. Additional information relating to the integrity of the semiconductor process used to manufacture the devices under test may also be compiled to verify that the results of the test development procedure have not been skewed.

22 Claims, 4 Drawing Sheets

LOW VOLTAGE SCREEN FOR IMPROVING THE FAULT COVERAGE OF INTEGRATED CIRCUIT PRODUCTION TEST PROGRAMS

BACKGROUND OF THE INVENTION

1. Field of the Invention

The present invention relates to testing of semiconductor devices, and more particularly to improving fault coverage of production test programs via establishment of a low voltage functional test screen.

2. Description of the Related Art

Semiconductor processing technology has advanced to the point where complete systems can now be reduced to a single integrated circuit or application specific integrated circuit (ASIC) device. These integrated circuits (also referred to as "die" or "chips") may use many functions that previously could not be implemented on a single die. It is common practice for the manufacturers of such integrated circuits to thoroughly test device functionality at the manufacturing site. However, due to the complex nature of today's integrated circuits and a concomitant sensitivity to variations in manufacturing processes, manufacturers are constantly confronted with new testing challenges in an effort to consistently provide defect-free products. Systems-on-a-chip, in particular, require a heavy investment in test development time and automated test equipment (ATE). Planning for testing must be done at the beginning of the design process.

The main goal of semiconductor test strategies is to screen out devices having functional or physical defects while establishing test limits that do not reject good devices. Many test development strategies have evolved, and often combinations of these strategies are utilized to provide a relatively high degree of fault coverage. Test development strategies include functional testing in which ATE test programs are executed. In functional testing, the device under test is stimulated by the ATE with specified inputs while the outputs are monitored to determine if they correspond with simulated logic values. Structural tests may also be utilized, and rely on a model of logical circuit faults. Structural tests sometimes begin with functional logic simulations that have been fault-graded and enhanced for higher fault coverage.

Another test development strategy, physical defect testing, involves creating specific tests designed to detect possible physical defects that can occur in an integrated circuit. Physical defect testing is useful for detecting defects that may not cause the device to fail functional or structural testing, but may lead to failure in the field. Defects in integrated circuits take many forms, some of which are test pattern sensitive. Gate oxide defects, drain-to-source current leaks (punch-through), and p-n junction current leaks (such as drain- or source-to-diffusion current leaks) tend to be pattern sensitive, while resistive shorts to ground or the power supply voltage are usually pattern insensitive. Quiescent current tests are a valuable tool in detecting such physical defects.

Generally, the result of test development is an ATE test program or test "sets" providing stimulus-response test "vectors" in the language of the ATE. The ATE test program causes the inputs of the device under test to be driven in a predetermined manner, while output pin voltages are measured and compared to stored test values. Current ATE test programs are derived mainly from the aforementioned functional and structural test development logic simulations.

Developing test programs is complicated by the fact that many different process variations can affect the device-to-device performance of integrated circuits. For example, differences in the physical properties of the metal layers used to interconnect transistors may result in disparities of propagation delays that a signal experiences when communicated over routing wires formed from the different metal layers. Often, the performance of the integrated circuitry can be dominated by propagation delays through longer metal interconnect wires rather than the basic gate delays of individual logic elements. This phenomena is exacerbated by the fact that as the width of a wire shrinks in deep submicron designs, the resistance of the wire generally increases. Process variations can also increase the resistances of the "via" structures used to couple the metal interconnect wires, also resulting in increased propagation delays. An increase in average propagation delays frequently result in a greater number of critical timing paths (e.g., signal paths in which best or worse case simulated propagation delays may approach the limits required for proper functionality). Many circuit timing problems involved such critical timing paths.

In order to avoid timing and other problems, integrated circuits are typically simulated in a software environment, using a variety of CAE tools, before the integrated circuits are actually fabricated. Such simulations function to reduce costly physical design iterations because modifications to an integrated circuit design are more readily achieved in software. Given the complexity of today's integrated circuits, accurate simulations is thus essential to a successful integrated circuit design. As noted, however, variations in the manufacturing process may cause the performance of an integrated circuit to deviate from simulated values.

Following fabrication of an integrated circuit, testing is performed to insure that the integrated circuit functions as designed. Although the integrated circuit may work functionally, it may not operate at the clock frequency at which it was designed to operate. Certain testing methodologies are employed to verify that the integrated circuit works "at speed." One such method is to test all circuitry functionally at the highest frequency at which the integrated circuit is designed to operate. At speed testing of all circuitry is typically not performed, however, because it is extremely difficult to create test patterns to verify an entire integrated circuit at the higher frequencies at which today's integrated circuits operate. Further, specialized testers are also required.

As a result, another method used to verify at speed functionality involves measuring a specified set of critical paths and assume that if these critical paths meet the timing specifications, all other paths are within a range of permissible simulation values. However, identification and measurement of critical paths is sometimes laborious.

To address such difficulties, process monitoring circuitry has been developed that resides on the integrated circuit itself. One such process monitor is the "PROCMON" cell developed by LSI Logic Corporation of Milpitas, Calif. The PROCMON circuits are analyzed during testing and their performance serves as a parametric indication of the integrity of the manufacturing process.

The PROCMON circuit utilizes the fact that in complementary metal-oxide-semiconductor (CMOS) circuits, the performance of the integrated circuit depends on the performance of both p-channel (PMOS) and n-channel (NMOS) transistors. Since the PMOS and NMOS transistors are formed at different stages of the manufacturing process, process variations at a given step may not affect the PMOS and NMOS transistors equally. The PROCMON circuitry includes short and long delay paths providing a first edge delay pulse in response to a logic level high to a logic low transition signal at the input terminal, and providing a second edge delay pulse when a logic low to logic high transition signal is provided at the same input terminal. The differences between the edge delay pulses are indicative of the relative performance of the PMOS and NMOS transistors being monitored. This difference is often quantified in terms of a "process factor" value K.

Even use of process monitor circuitry such as the PROCMON circuit, however, may not provide the desired degree of fault coverage for certain product designs. Some process variations, such as those affecting the physical properties of metal interconnections in multiple layer metallization processes, may result in failures that avoid detection by current process monitoring circuitry and typical functional test programs.

SUMMARY OF THE INVENTION

Briefly, the present invention provides a method for improving the fault coverage of functional tests for integrated circuits by establishing a design-specific low voltage functional screening procedure. The low voltage functional screen reveals potentially failing devices which may pass traditional test programs.

In the disclosed embodiment of the invention, a reduced voltage test threshold is established by comparing the results of an iterative test procedure executed on a set of known good integrated circuits and integrated circuits which have passed traditional functional test programs but manifested problems in the field. For a given device under test, the iterative procedure commences by applying a system clock and nominal power supply voltage to the device under test. A set of functional test vectors is then executed on the device using ATE. The results are compared with expected test results to determine if the device is a passing device under the initial test conditions. If so, the power supply voltage is decremented by a predetermined value and the test process is repeated. This iterative process continues until the device under test fails the functional test.

At this point, the power supply voltage at which the device under test has failed functional testing or, alternatively, the previous power supply voltage, is stored in a database. The testing procedure is then repeated for a statistically significant group of additional known good parts/bad parts. After databases have been compiled for the good and bad parts, the results of the testing procedure are examined to determine the voltage below which substantially all the known good parts pass and above which substantially all the bad parts fail. This voltage is then utilized as the reduced voltage test threshold value for a production test program. Additional information relating to the integrity of the semiconductor process used to manufacture the devices under test may also be compiled to verify that the results of the test development procedure have not been skewed. Thus, the test development procedure according to the present invention allows a low voltage screening process to be established which rejects devices having functional or physical defects while establishing reduced voltage tester limits that do not reject good devices.

BRIEF DESCRIPTION OF THE DRAWINGS

A better understanding of the present invention can be obtained when the following detailed description of the preferred embodiment is considered in conjunction with the following drawings which.

DETAILED DESCRIPTION OF THE PREFERRED EMBODIMENT

Figure 1:
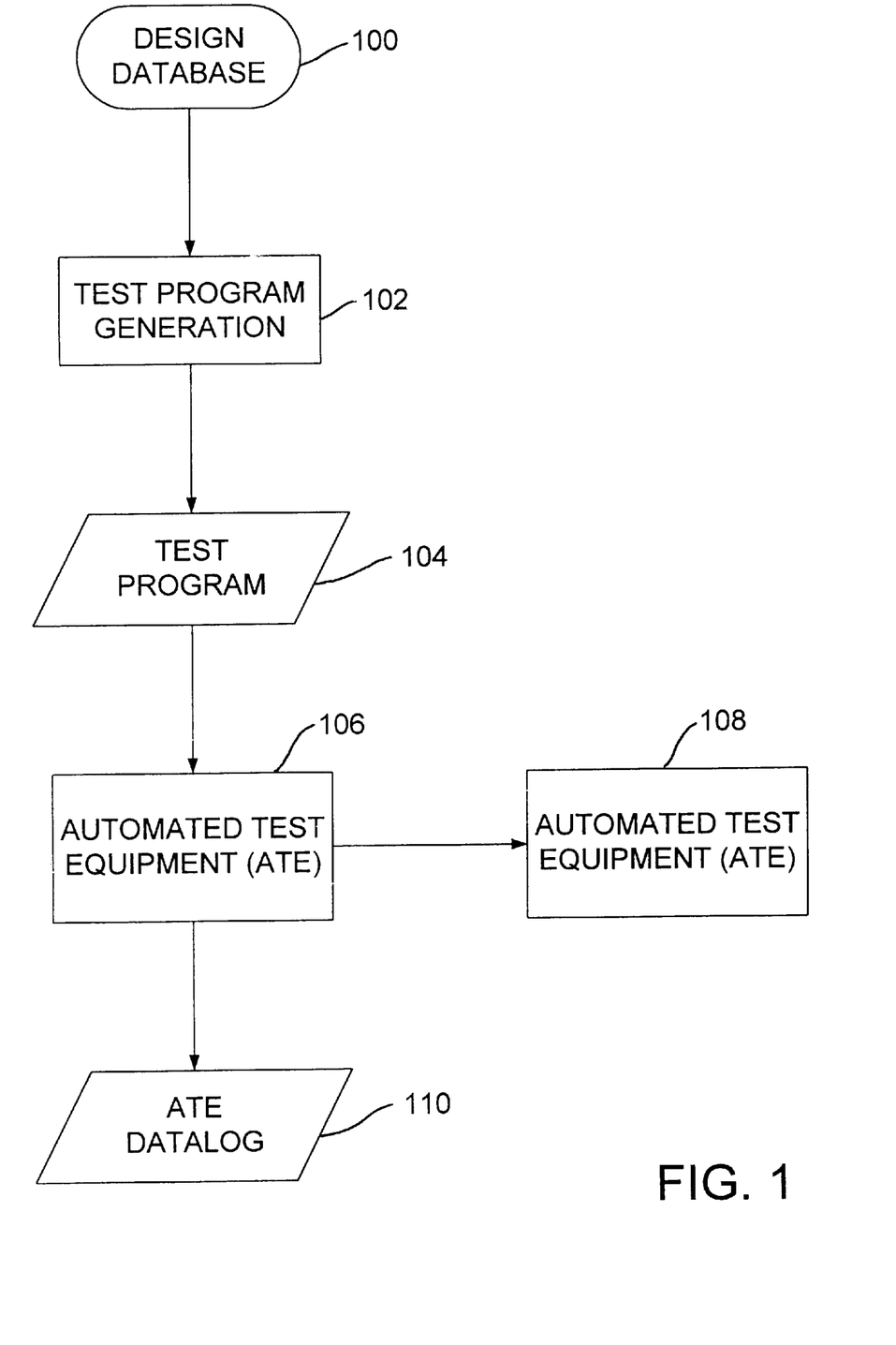
FIG. 1 is a block diagram depicting a typical ATE test procedure.

Referring now to FIG. 1 a block diagram of the steps involved in a typical testing procedure for a integrated circuit device is shown. Initially, as shown in step 100, a design database is generated for the integrated circuit device. The design database contains all the information required to manufacture a semiconductor device, including simulation data needed to verify the operation of the device. In general, the design database consists of a "net list" which describes the actual circuitry and interconnections of the design, libraries containing data regarding the various elements which comprise the design, such as parameters for external signals, and the stimulation data for use in testing the design.

Information contained in the design database 100 is provided to a test program generator 102. The test program generator 102 generates a test program from the design database for execution by the ATE. The test program typically includes a database of external signals and their type, thereby determining what tests are performed, and the appropriate executable program code for the automated test equipment. The test program 104 generated by the program generator is then loaded into the automated test equipment 106. Next, the device under test 108 is connected to the automated test equipment 106, and the test program 104 is executed in a manner generally known to those skilled in the art. The precise manner in which the device under test 108 is coupled to the automated test equipment 106 is not considered critical to the invention.

The result of each test performed on device 108 by ATE 106 is stored in an ATE "datalog" 110. Following completion of the test program 104, the results of the test stored in the ATE datalog 110 are compared to the design requirements in the design database 100 to determine whether the device has performed satisfactorily on each test. The ATE datalog 110 is utilized as described below to establish a tester limit(s) for a low voltage screen that is used to identify problematic devices that may pass typical functional tests.

Figure 2A:
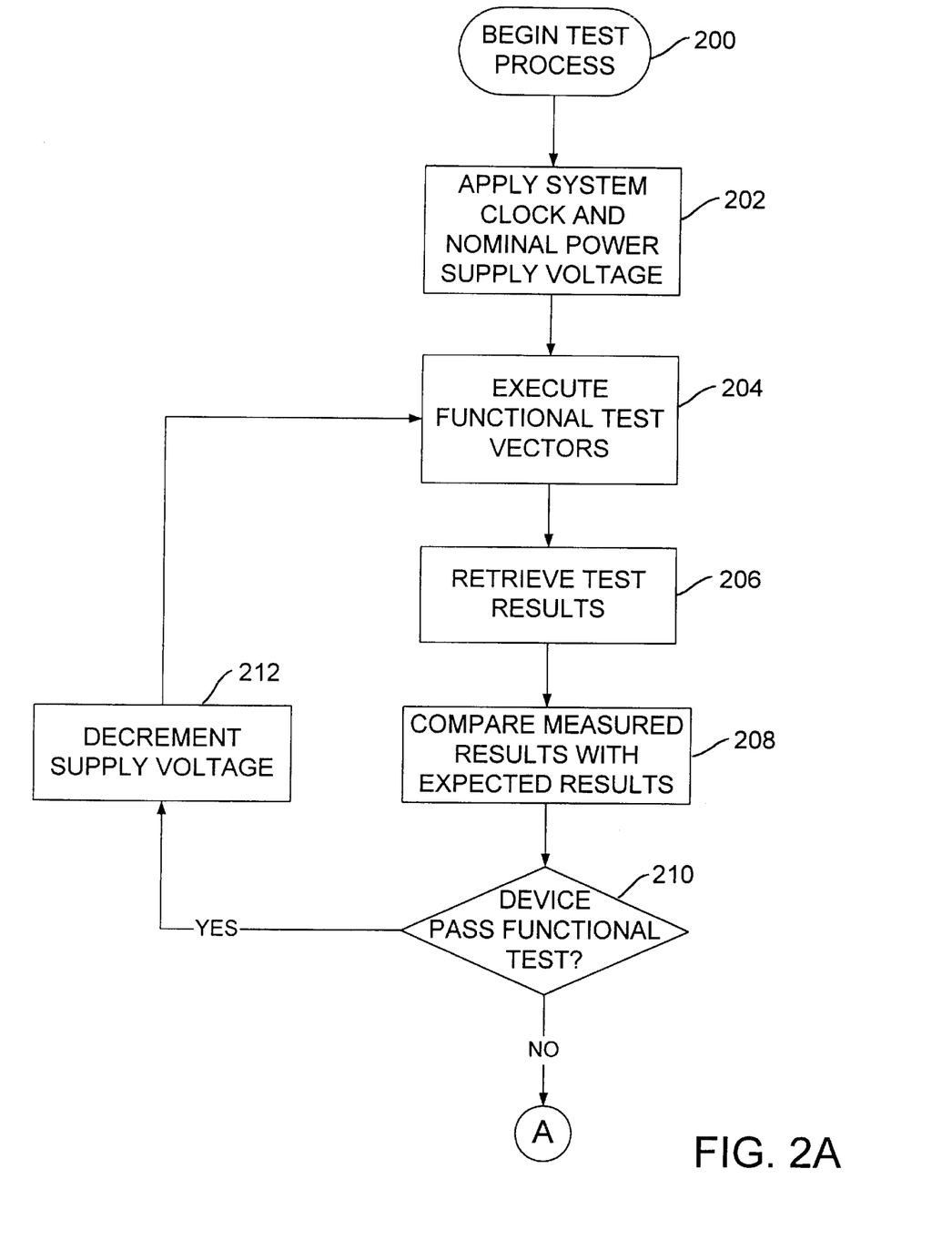
FIGS. 2A and 2B are flowchart diagrams of a procedure according to the invention for establishing a device dependent low voltage test threshold value.
Figure 2B:
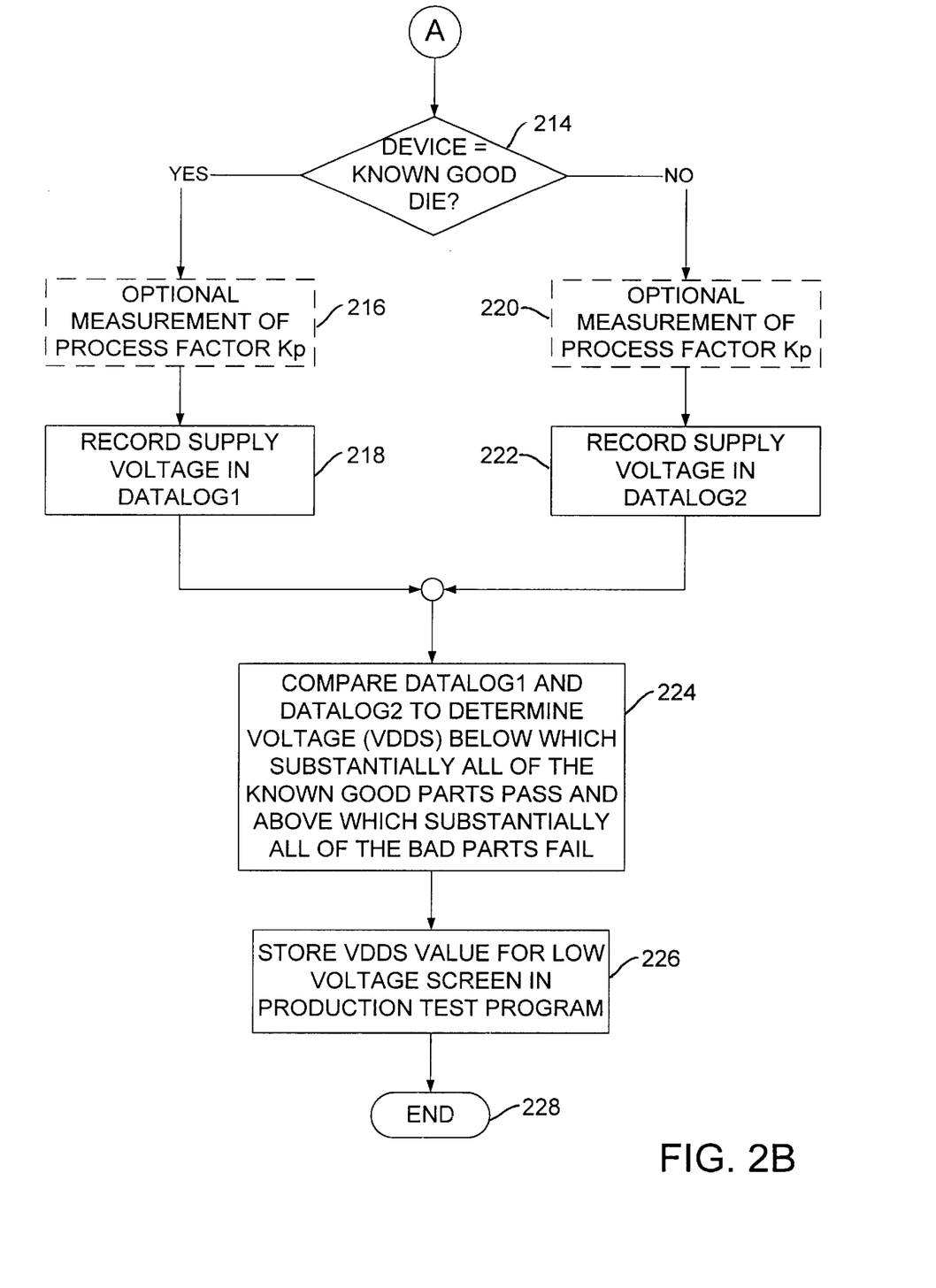

Referring now to FIGS. 2A and 2B, an exemplary procedure for establishing a device dependent low voltage screen (VDDS) threshold value is shown. The procedure preferably utilizes a combination of known good devices in conjunction with suspect devices which pass the typical functional tests but manifest problems in the field. Following commencement of the test process into 200, a nominal power supply voltage and system clock are applied to the device under test in step 202. The system clock may be configured to operate at the clock frequency at which the device under test is designed to operate ("at speed"), or, alternatively, the frequency of the system clock may be lowered to provide for a gross functional test. The precise frequency at which the system clock is established is not considered critical to the invention. Further, in the preferred embodiment of the invention the test procedure of FIGS. 2A and 2B is performed at room temperature.

Next, in step 204, functional test vectors from a specialized test program are executed and applied to the inputs of the device under test 108. Results of the test program are retrieved in step 206. These results are then compared, in step 208, with data representing expected test results corresponding to the test vectors of step 204.

Control then proceeds to step 210, where it is determined if the device under test 108 has passed the functional test. If so, the power supply voltage at which the device under test 108 was exposed to during the initial functional test procedure is decremented (step 212) by a predetermined value (e.g., 0.05 volts). The test process returns to step 204, where the functional test vectors are executed at the new supply voltage. This iterative process is repeated until it is determined in step 210 that the device under test 108 has failed the functional test routine. When this event occurs, the test process continues to step 214 (FIG. 2B) to ascertain if the device under test 108 is a known good die. If so, control proceeds to optional step 216 where other information regarding the device under test 108 (or the lot in which it was manufactured), such as information relating to the process factor $K_p$, is retrieved. As previously described, the process factor $K_p$ provides an indication of the relative performance of the PMOS and NMOS transistors used to form the logic gates of the device under test 108.

Next, in step 218, the supply voltage (i.e., the initial voltage at which the device under test 108 fails functional testing) is recorded in a first ATE datalog DATALOG1. Alternatively, the current supply voltage could be stored. If the device under test 108 is identified as other than a known good die in step 214, as might be the case if the device experienced faults following incorporation in an end product, control proceeds to step 220 where an optional measurement of the process factor $K_p$ for the device under test 108 is performed. Control then passes to step 222 and the supply voltage at which the device under test 108 first failed the functional test is stored in a second ATE datalog DATALOG2. In the disclosed embodiment of the invention, the second ATE datalog DATALOG2 is used to record information regarding devices which passed normal functional testing at the specified operating voltages for the device, yet experienced problems during additional testing or after being incorporated in an end product.

Following either of steps 218 or 222, and assuming that enough devices have been tested to form a statistically significant sample, the testing procedure continues to step 224 and the first and second ATE datalogs DATALOG1 and DATALOG2 are compared to ascertain the power supply voltage or range of voltages below which substantially all of the known good parts pass functional testing and above which substantially all of the "bad" parts fail functional testing. This voltage is referred to herein as the low voltage screen VDDS threshold. Next, in step 226, the low voltage screen VDDS threshold, is stored for use in a low voltage screening process of a production test program such as that described below in conjunction with FIG. 3. The test development procedure then ends in step 228.

Although shown at specific points in the test procedure, the optional measurements of steps 216 and 220 could occur at any point in the procedure. Further, the measurements of steps 216 and 220 can also be stored in the DATALOG1 and DATALOG2, respectively.

In the disclosed embodiment of the invention, and as indicated in the attached charts, the process factor $K_p$ is utilized to verify that the failures detected in step 210 are not attributable to a flagrant process deviation. The failure mechanism of devices which do not pass a low voltage screening process in accordance with the present invention could be attributable to a number of factors not related to the process factor $K_p$. Preferably, as evidenced by the attached charts, normal variations in the process factor $K_p$ do not influence the low voltage screen VDDS threshold.

For example, process variations that cause deviations from the ideal electrical characteristics of metal interconnections between circuit components may alter the functionality of a device irrespective of the relative strengths of the transistors used to form logic gates in the device. As an additional example, the interconnect wires coupling the various components of an integrated circuit are themselves electrically coupled by "via" structures. As known to those skilled in the art, a via structure is an opening in the insulating layer between metal layers that provide an electrical pathway from one metal layer to the metal layer above or below it. Process variations, however, can sometimes cause the via structures to exhibit resistances that exceed normal design and simulation parameters. Again, such resistances can cause faulty timing conditions.

Referring more specifically to the attached charts, Chart 1 depicts the results of an exemplary low voltage screening procedure according to the present invention. This chart shows failing voltages (plotted on the y-axis as VDDH) over a range of process factor $K_p$ values (x-axis). As can be seen, a large number of devices pass functional testing below a certain threshold voltage (in this case, approximately 2.2 volts), while relatively few devices fail at this voltage. This can be seen more clearly with reference to Chart 2, where failing voltage values have been plotted for a large number of devices. Again, below approximately 2.2 volts most of the known good devices pass the low voltage screening procedure, while bad devices tend to fail at higher voltage levels. Chart 3 provides a more detailed analysis of the failing voltage for devices that passed traditional functional testing but demonstrated problems in the field. As can be seen from the charts, such bad devices fail functional testing before reaching the low voltage screen VDDS threshold value (~2.2 volts), and as a result are not provided to end users.

Figure 3:
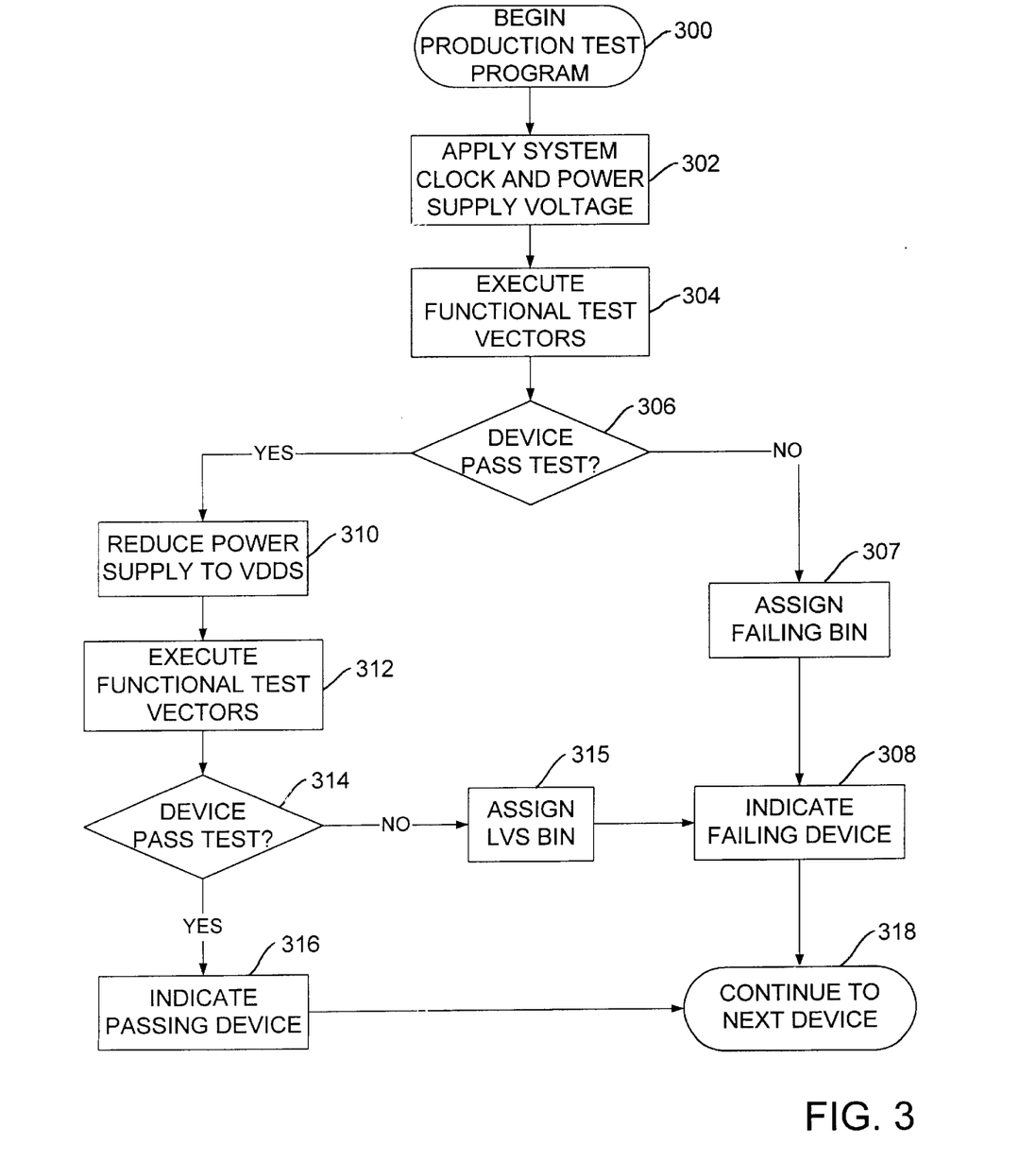
FIG. 3 is an exemplary production test procedure utilizing the low voltage test threshold value established by the procedure of FIGS. 2A and 2B.

Referring now to FIG. 3, an exemplary production test procedure utilizing the low voltage screen VDDS threshold value established by the procedure of FIGS. 2A and 2B is illustrated. Following commencement of the production test program in step 300, a system clock and power supply voltage are provided to the device under test in a traditional manner. Next, in step 304, the device under test is subjected to functional test vectors.

The test program then proceeds to step 306 where the results of step 304 are examined to determine if the device is a passing device. If not, the device under test is assigned to a failing bin in step 307 and then marked or otherwise indicated as a failing device in step 308. It should be noted at step 304 that the functional test vectors may be executed under a variety of voltage levels above the low voltage screen VDDS threshold value, as well as various temperatures and frequencies corresponding to the specified operating ranges for the device. If the functional test vectors are executed under more than one set of such conditions, the results of each pass are examined in step 306.

If the device passes all of the traditional functional tests as determined in step 306, the low voltage screen portion of the production test program commences in step 310, where the power supply voltage is reduced to the low voltage screen VDDS threshold value determined by the test development procedures of FIGS. 2A and 2B. Next, in step 312, functional test vectors are exercised on the device under test using the low voltage screen VDDS threshold for the power supply voltage. The functional test vectors of step 312 may correspond to the functional test vectors of step 304, or different test vectors may be utilized. Further, the system clock is preferably the same during the initial functional testing of step 304 and the low voltage screen testing of step 312, although it is contemplated that the system clock may be set to a lower frequency to provide "gross" functional testing in step 312.

Following execution of the functional test vectors in step 312, the low voltage screening procedure determines (step 314) if the device under test has passed the functional testing at the lowered supply voltage. If not, the device under test is assigned to a low voltage screen (LVS) bin in step 315 and indicated to be a failing device in step 308. Providing a separate LVS bin for devices which pass the functional testing of step 304 but fail the low voltage screen of step 312 aids in failure analysis. If the device passes the low voltage screen as determined in step 314, it is indicated as being a good device in step 316 and the production test program continues to the next device in step 318.

In addition to the aforementioned variations in the frequency at which the test programs of FIGS. 2A, 2B and 3 can executed, it is contemplated that the temperature at which the test programs are executed could be varied as well, although room temperature is preferred. The clock frequency and temperature applied to the device under test

108 could be varied, for example, if problems are encountered in identifying a low voltage screen VDDS threshold value in step 224 of FIG. 2B.

Thus, a low voltage screening process for improving the fault coverage of integrated circuit production test programs has been described. The development of this new low voltage screen involves an iterative process in which a reduced test voltage is identified below which good devices pass functional testing while bad devices fail. The low voltage screen may be established on a device-by-device basis.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

CHART 1

CHART 2

What is claimed is:

1. A method for developing a low voltage screening process for testing integrated circuits on automated test equipment, the method comprising the steps of:
    providing an integrated circuit for testing;
    applying a first power supply voltage to the integrated circuit;
    executing test vectors of a functional test program the integrated circuit;
    comparing the results of the functional test program with expected test results to determine if the integrated circuit passes the functional test; and, if so,
    iteratively decrementing the first power supply voltage by a predetermined value and repeating the steps of executing test vectors and comparing the results until it is determined that the integrated circuit fails the functional test; and
    storing a value representing the power supply voltage at which the integrated circuit first fails the functional test.

2. The method of claim 1, further comprising the steps of:
    repeating each of the previous steps for additional integrated circuits; and
    comparing the stored values to identify the lowest tested power supply voltage below which substantially all of the integrated circuits pass the functional test, the identified power supply voltage being useful for establishing a reduced voltage screening procedure for a production test program.

3. The method of claim 2, wherein the additional integrated circuits comprise known good devices.

4. The method of claim 2, wherein the additional integrated circuits comprise a combination of known good devices and faulty devices, the faulty devices passing standard functional testing procedures yet manifesting timing problems, the step of comparing the stored values comprising identifying the lowest tested power supply voltage below which substantially all of the integrated circuits pass the functional test and above which substantially all of the faulty devices fail the functional test.

5. The method of claim 1, wherein the first power supply voltage is within the specified range of operating voltages for the integrated circuit.

6. The method of claim 1, further comprising the steps of:
    measuring a parametric value relating to the integrity of the semiconductor process used to fabricate the integrated circuit; and
    comparing the measured parametric value to a predetermined range of acceptable values.

7. The method of claim 6, wherein the parametric value is a process factor value indicating the relative performance of transistors utilized by the integrated circuit.

8. The method of claim 6, wherein the step of measuring a parametric value comprises examining process monitor circuitry located on the integrated circuit.

9. The method of claim 1, wherein the functional test is performed at the nominal operating frequency of the integrated circuit.

10. The method of claim 1, wherein the functional test is performed at room temperature.

11. A method for testing integrated circuits on automated test equipment, the method incorporating a low voltage screening procedure, comprising the steps of:

provided an integrated circuit for testing;

applying a first power supply voltage to the integrated circuit, the first power supply voltage within the range of specified operating voltages for the integrated circuit;

executing test vectors of a production test program on the integrated circuit;

comparing the results of the production test program with expected test results to determine if the integrated circuit passes the production test program; and, if so, reducing the first power supply voltage to a predetermined reduced voltage screening value;

executing test vectors of a screening test program on the integrated circuit; and comparing the results of the screening test program with expected test results to determine if the integrated circuit passes the screening test program.

12. The method of claim 11, wherein the production test program and the screening test program are functional tests programs.

13. The method of claim 12, wherein the production test program and the screening test program are substantially the same.

14. The method of claim 11, wherein the reduced voltage screening value is below the specified range of operating voltages for the integrated circuit.

15. The method of claim 14, wherein the reduced voltage screening value is dependent on the design of the integrated circuit.

16. The method of claim 11, further comprising the steps of:

measuring a parametric value relating to the integrity of the semiconductor process used to fabricate the integrated circuit; and comparing the measured parametric value to a predetermined range of acceptable values.

17. The method of claim 16, wherein the parametric value is a process factor value indicating the relative performance of transistors utilized by the integrated circuit.

18. The method of claim 16, wherein the step of measuring a parametric value comprises examining process monitor circuitry located on the integrated circuit.

19. The method of claim 11, wherein the production test program is performed at the nominal operating frequency of the integrated circuit.

20. The method of claim 19, wherein the screening test program is performed at a clock frequency less than the nominal operating frequency of the integrated circuit.

21. The method of claim 11, wherein the screening test program is performed at room temperature.

22. The method of claim 11, further comprising the step of marking the integrated circuit as a bad device if it fails the screening test program.

* * * * *